United States Patent

Morimoto et al.

[11] Patent Number: 5,961,557
[45] Date of Patent: Oct. 5, 1999

[54] DESIGN SUPPORT SYSTEM AND METHOD THEREFOR

[75] Inventors: Kazunobu Morimoto; Shun Ishiyama; Osamu Tada; Satoshi Fujiwara, all of Hadano, Japan

[73] Assignees: Hitachi, Ltd., Tokyo; Hitachi Computer Electronics, Co., Ltd., Kanagawa-ken, both of Japan

[21] Appl. No.: 08/654,762

[22] Filed: May 29, 1996

Related U.S. Application Data

[63] Continuation of application No. 08/285,657, Aug. 3, 1994, abandoned.

[30] Foreign Application Priority Data

Aug. 9, 1993 [JP] Japan .................................. 5-197357

[51] Int. Cl.⁶ .................................................. G06G 7/78
[52] U.S. Cl. .............................. 701/1; 364/488; 364/578; 364/489; 395/500
[58] Field of Search .................................. 364/488, 489, 364/490, 491, 578, 481, 492, 131; 395/500, 389, 391, 966, 183.07, 557, 559, 800; 371/3, 70, 53, 34, 5.5; 702/117, 122; 324/73.1; 701/1

[56] References Cited

U.S. PATENT DOCUMENTS

| | | | |
|---|---|---|---|
| 4,084,224 | 4/1978 | Appell et al. | 364/200 |
| 4,306,286 | 12/1981 | Cocke et al. | 364/200 |
| 4,393,446 | 7/1983 | Gurr et al. | 395/557 |
| 4,527,249 | 7/1985 | Van Brunt | 364/578 |
| 4,744,084 | 5/1988 | Beck et al. | 371/23 |
| 4,984,239 | 1/1991 | Suzuki et al. | 395/183.07 |
| 5,313,398 | 5/1994 | Rohrer et al. | 364/468 |
| 5,325,309 | 6/1994 | Halaviati et al. | 364/488 |
| 5,335,191 | 8/1994 | Kundert et al. | 364/578 |
| 5,384,720 | 1/1995 | Ku et al. | 364/578 |

FOREIGN PATENT DOCUMENTS 4-188333  7/1992  Japan .

*Primary Examiner*—Jacques H. Louis-Jacques
*Attorney, Agent, or Firm*—Fay, Sharpe, Beall, Fagan, Minnich & McKee

[57] ABSTRACT

A design support system for executing logic verification so as to perform work management, progress state management and logic quality management efficiently in a logic verification process and so as to improve the man-hour for development and the throughput of computer resources. For every verification item to be executed, management information including a verification item number for identifying a verification item, confirmation information for indicating the fact that no failure has been confirmed in the verification item, a prerequisite verification item number for identifying another verification item required to be confirmed as a prerequisite for the verification item is stored in a memory of the system. Before execution of logic simulation which is performed by giving test data for logic verification of the design data to the design data as a subject of logic verification, data in the memory are searched so that logic simulation is executed in the case where all verification items as prerequisites for verification items to be executed have been already confirmed.

18 Claims, 6 Drawing Sheets

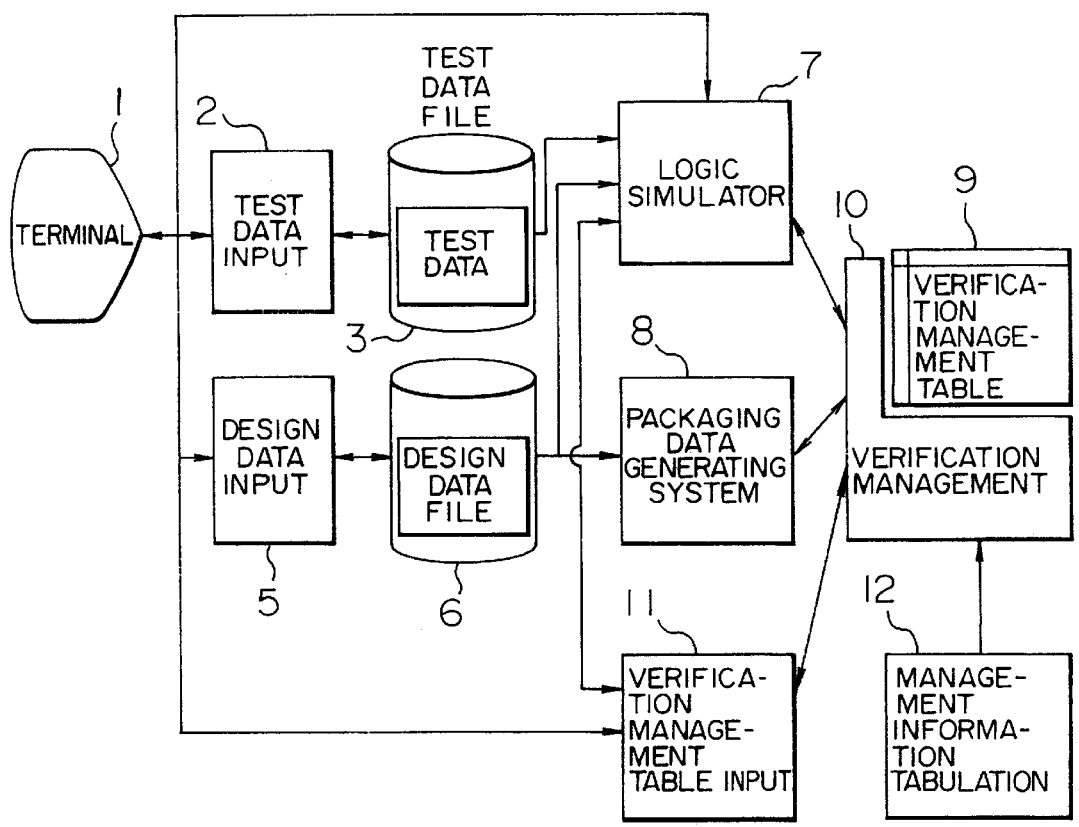

DESIGN SUPPORT SYSTEM AND METHOD THEREFOR

This is a continuation of application Ser. No. 08/285,657; filed Aug. 3, 1994, now abandoned.

BACKGROUND OF THE INVENTION

The present invention relates to a system of supporting designing of a computer system and, particularly, relates to a design support system adapted for use in work management in a process of logic verification of computer system design data and a process following the first-mentioned process.

Logic verification is generally one important process in development of a computer system. Before a prototype machine is produced really, sufficient logic verification is performed to secure logic quality, so that verification on the prototype machine can be performed in a short time to reduce the number of times of redesigning of the prototype machine to thereby reduce both the time and cost required for the development. As one of means for supporting the logic verification, logic simulation is known. It is however not possible to perform perfect logic verification only by using logic simulation. Accordingly, also manual, desk verification becomes essential.

The aforementioned logic verification is generally carried out by the following method.

First of all, a specification for verification is generated on the basis of a specification for design of logic which is a subject of logic verification. This specification for verification provides the outline of verification content and method. Then, verification items are generated on the basis of the specification of these verification content and method. In the generation of verification items, verification means to be used such as logic simulation, manual checking, etc. are determined for every verification item and, at the same time, the date scheduled to be digested is determined for every verification item. Generally, verification is started from a basic function and other functions are verified gradually successively. Then, a logic simulation environment is constructed on the basis of the specification for verification. Then, the verification items are digested by logic simulation and desk verification manually.

In the case where logic simulation is used for verification, first, test data and an expected value thereof are generated in accordance with each of the verification items. Logic simulation is executed by using the test data, and the result of the simulation is compared with the expected value to thereby determine success/failure. If the result as has been expected is obtained, the verification item is considered to be already digested. Otherwise, a measure obtained by logic analysis is applied and then verification on the item in question is executed again.

The afore-mentioned method is a general logic verification method. However, there arises a problem that not only logic verification means and accuracy but also management in progress of a process and quality of logic becomes difficult as the logic scale of the computer system increases.

That is, since the larger the number of items to be verified becomes the larger the logic scale becomes, it is necessary that a project team is constituted by a large number of members so that logic verification is performed by the large number of members. Assume now that, for example, all the members or managers are classified into verification managers and logic correction managers, and that the verification managers are further classified into desk verification managers and logic simulation managers. At this time, in accordance with the logic scale to be handled, there is a case where even the required number of the logic simulation managers becomes from the order of several persons to the order of tens of persons.

In the logic verification executed by such a project team, management of the state of digestion of verification items and management of the state of extraction of failures and measure thereof become important. If these managements are insufficient, the state of progress becomes worse so that the state of production of failures cannot be grasped accurately. Accordingly, there is a risk that it becomes difficult to secure logic quality in an early stage. Further, the logical problem which arises currently cannot be transmitted to the whole project team, so that returns inward may be caused by execution of wasteful logic simulation and the like. Accordingly, there is a risk that the throughput in the computer resources as well as in the man-hour becomes worse.

As a conventional technique for supporting such management of logic verification as mentioned above, for example, a failure measure management system described in JP-A-4-188333 is known.

In this technique, a logic verification manager registers failure information on a table in the failure management system whenever a logic failure is extracted through logic simulation or the like. Totalization and display of failure information is performed by the system. By using the information, a verification process manager manages logic quality and the state of progress of verification.

Generally, when a failure is extracted in verification of a certain item, verifying work such as logic simulation, etc. with respect to the verification item from which the failure is extracted must be interrupted unless the measure counter to the failure is completed and, in addition, verifying work with respect to other verification items scheduled to be executed after the confirmation of the item must be interrupted.

(1) The conventional technique cannot be adapted for handling the aforementioned management. Accordingly, the management must be carried out manually by the verification manager. Because the number of verification items to be handled increases as the project scale becomes large, a great deal of time and labor is required for the management.

(2) Further, in the conventional technique, the state of extracted failures must be inputted manually, so that a large load due to the man-hour required for inputting failure information for the purpose of failure management is imposed on the logic verification manager who is always driven by execution and confirmation of logic simulation.

(3) Generally, after the completion of the logic verification, a process of generating packaging data to arrange parts and logic blocks to thereby determine wiring is carried out. However, when the packaging data generating process is to be carried out under the condition in which logic verification is insufficient, returns inward will be caused by the production of serious failures. Conventionally, because this management is put into human hands, a packaging process may be carried out before confirmation of completeness of the logic verification. Accordingly, there arises a problem that returning of process may be caused by failures after the packaging process.

SUMMARY OF THE INVENTION

An object of the present invention is to provide a design support system in which not only work management, progress state management and logic quality management in a logic verification process can be made efficiently but also the throughput in the man-hour for development and in computer resources can be improved.

That is, an object of the present invention is to provide a design support system in which (1) management of the state of extraction and correction of failures for every verification item and management of verifying work in accordance with the failure management can be made consistently and efficiently, (2) management of the state of progress of a verifying process and management of the state of logic quality can be supported without any delay while the load imposed on the verification manager is minimized, and (3) returns inward at the time of entering into processes after the verification process can be reduced.

To achieve the foregoing object, there is provided a design support system comprising a logic simulation execution means for executing logic simulation by giving test data for logic verification of design data to the design data as a subject of logic verification, wherein the system further comprises means for making a determination, when a certain verification item is to be executed, as to whether the logic simulation for the certain verification item is to be executed or not before the execution of the logic simulation, on the basis of the relation between the certain verification item and another verification item, and for giving an instruction to the execution means on the basis of the result of the determination.

Because a determination is made as to whether logic simulation is to be executed or not before the execution of the logic simulation, wasteful execution of logic simulation can be avoided.

The design support system further comprises a table storage means for relationally storing, for every verification item to be executed, a verification item number for identifying the verification item, confirmation information for indicating the fact that it is confirmed that there is no failure in the verification item, and a prerequisite verification item number for identifying another verification item which is required to be confirmed as a prerequisite for execution of the verification of the verification item, whereby the instruction means retrieves verification items as prerequisites for the verification items by referring to the table storage means before the logic simulation executed by the execution means and retrieves confirmation information with respect to the retrieved verification items to thereby determine whether all the verification items as prerequisites for the verification items to be executed have been already confirmed or not yet. Because the execution means is instructed to execute in the case where the all verification items as prerequisites have been already confirmed, the retrial of execution of logic simulation and the like caused by the prerequisite verification items proved to be unconfirmed after the execution of the logic simulation can be avoided. Accordingly, the wasteful man-hour for logic verification can be reduced.

Further, a visual output means for visually outputting the result of logic simulation is connected so that in the case where there is any unconfirmed verification item in the all prerequisite verification items, the unconfirmed verification item is retrieved and given to the visual output means. As a result, the designer or logic simulation operator can be informed of as to which one of the verification items must be executed earliest of all.

In the case where it is confirmed that a failure occurs in the result of logic verification, logic simulation is executed again after the change of design data is made by the designer.

In the present invention, the following configuration is further described in order to prevent the retrial of execution of logic simulation in the case where the change of the design is not yet made.

That is, a verification item number for identifying a verification item, a failure state for indicating whether there is any failure in the result of the last logic simulation of the verification item, and a design data history for indicating the design data version used in the last logic simulation of the verification item, are stored in the table storage means for every verification item to be executed, whereby the table storage means is searched before the execution of the logic simulation so that the execution means is not permitted to execute in the case where a failure state is produced by the last logic simulation of the verification item to be executed and where the design data version used in the current logic simulation is equal to the design data version stored in the table storage means.

The system according to the present invention further comprises an updating means for comparing the result of the thus executed logic simulation with an expected value thereof to determine the success/failure of execution and record the result of the determination in the recording means to thereby update the table storage means. Accordingly, the confirmation state of the verification item can always remain in the newest state.

The system according to the present invention further comprises means for determining whether all necessary verification items have been already confirmed, at the time of execution of the packaging data generating process. Accordingly, returns inward from the next process can be avoided.

As described above, according to the present invention, (1) execution of logic simulation can be voided in the case where there is any item which must have been confirmed but is not yet confirmed or in the case where there is no measure given to the failure extracted, (2) the number of verification items scheduled to be digested, the number of digested verification items and the number of extracted failures can be outputted automatically in the form of a graph or the like, and (3) use of objective design data can be prevented when necessary verification items are not yet digested in the process after the verification process. Hence, in the present invention, not only the improvement of throughput in the work man-hours and in computer resources but also the efficient use of work management, progress management and logic quality management can be achieved in a large-scaled logic verification project.

BRIEF DESCRIPTION OF THE DRAWINGS

An embodiment of the design support system according to the present invention will be described below in detail with reference to the drawings. The following description of an embodiment of the present invention shows the case where the present invention is applied to a system for performing logic verification laying stress on logic simulation.

FIG. 1 is a functional block diagram showing the structure of a system according to an embodiment of the present invention;

FIG. 2 is a view showing an example of the data structure of the verification management table;

DESCRIPTION OF THE PREFERRED EMBODIMENTS

Figure 3:
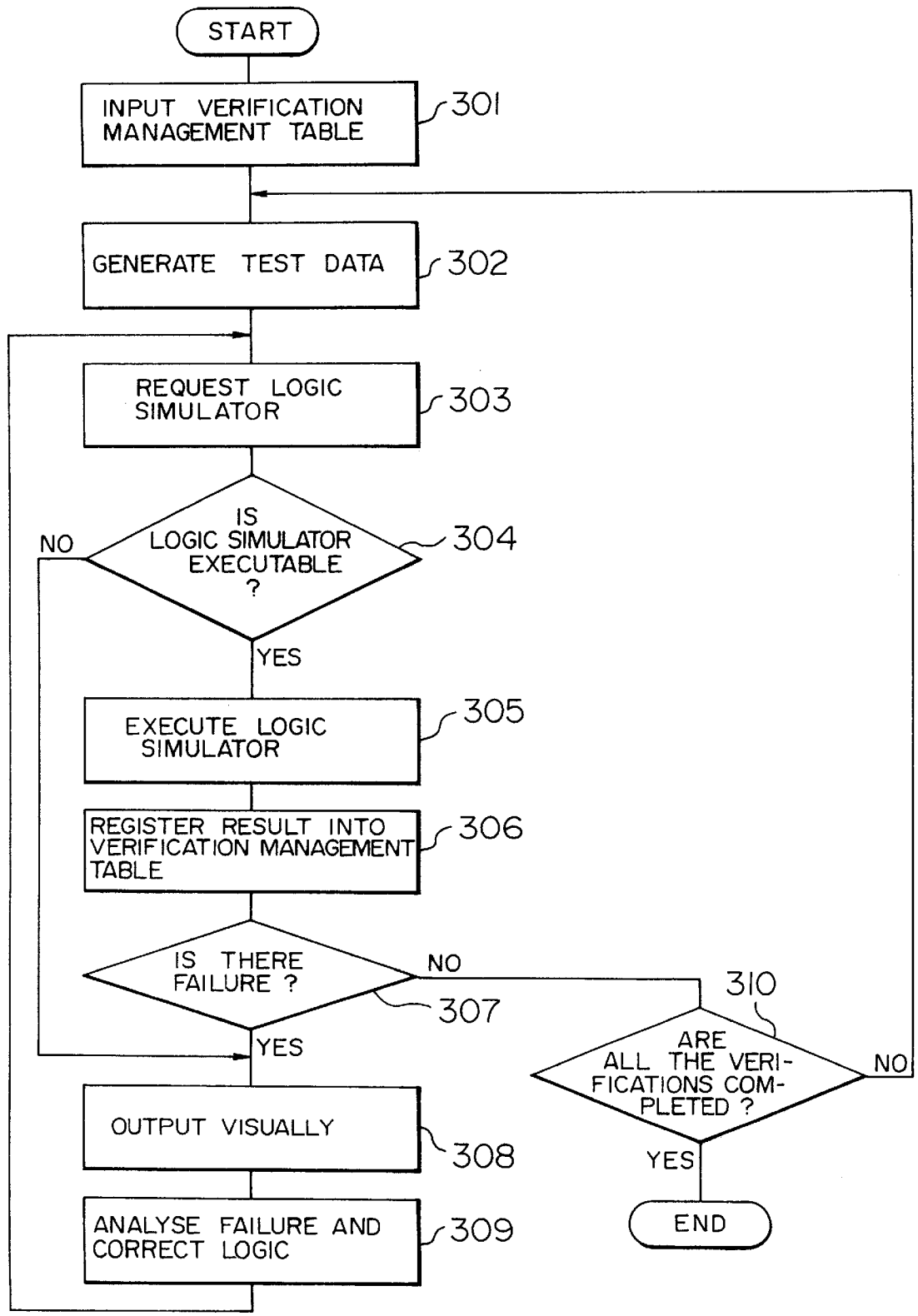
FIG. 3 is a flow chart showing an example of logic verification routine.

In FIG. 1, the system configuration has: a terminal 1 having a keyboard and a mouse as input devices and having a display and a printer as output devices; a test data input section 2; a test data file 3; test data 4; a design data input section 5; a design data file 6; a logic simulator 7; a packaging data generating system 8; a verification management table 9; a verification management section 10; a verification management table input section 11; and a management information totalizing section 12.

In an embodiment of the present invention shown in FIG. 1, the test data input section 2 is supplied, through the terminal 1, with the test data 4 generated by a verification manager and registers the test data 4 in the test data file 3. Specifically, each of the thus inputted test data 4 is given a specific number (a test data number 23) and stored in the test data file 3.

The design data input section 5 is supplied, through the terminal 1, with logic data generated by a logic designer and registers the logic data in the design data file 6. When design data as a subject of verification and test data used in the verification are designated, the logic simulator 7 reads the test data 4 from the test data file 3 and executes logical simulation with respect to the design data on the design data file 6.

The packaging data generating system 8 generates packaging information, for example, by determining wiring through simulation arrangement of parts, logic blocks, etc. on the basis of the logic data in the design data file 6. Management information necessary for management of verification of verification items is stored in the verification management table 9 for every verification item. The number of the test data to be used in the logic simulation for verification of the required logic item, the state of production of failure, the state of correction, the state of confirmation, and the number of the verification item which must have been confirmed as a promise for verification of each item (hereinafter referred to as prerequisite verification item), are registered as the management information.

The verification management section 10 retrieves necessary information from the verification management table 9 in response to inquiry from the logic simulator 7 or the like, and gives permission for execution or gives information necessary for totalization to the management information totalizing section 12. The verification management table input section 11 is supplied, through the terminal 1, with information to be registered in the verification management table 9 so that the verification management table input section 11 registers the supplied information in the verification management table 9. The management information totalizing section 12 totalizes the state of digestion of verification items, the state of extraction of failures and the like, edits those states into the understandable form such as a graph, and then outputs the result of edition.

Figure 8:
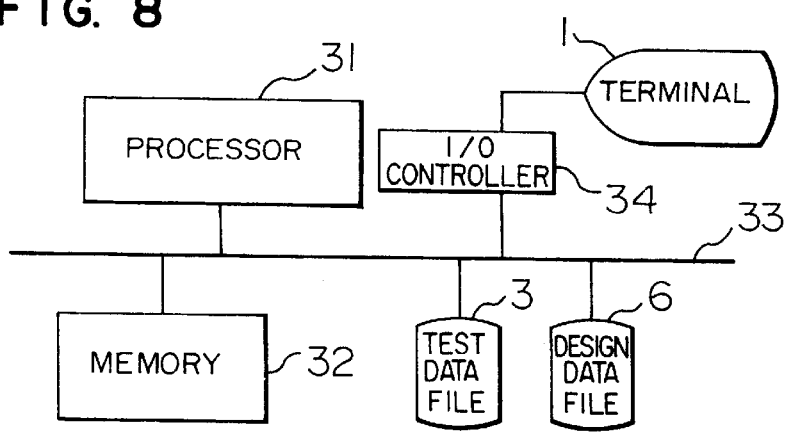
FIG. 8 is a block diagram showing the configuration of the system according to the present invention.

FIG. 8 is a diagram showing the structure of the system according to the present invention. In FIG. 8, the system includes a terminal 1, a test data file 3, a design data file 6, a processor 31, and a memory 32. The memory 32 stores not only the verification management table 9 but also programs for operating the logic simulator 7, the packaging data generating system 8, the verification management section 10, the management information totalizing section 12, and so on. When logic simulation, generation of packaging data or the like is to be performed, the processor 31 reads the respective programs from the memory 32 and executes logic simulation or the like in accordance with the programs or controls the terminal, the files and the like connected to the bus 33. The reference numeral 34 designates an I/O control section which carries out the operations of the test data input section 2, design data input section 5 and verification management table input section 11.

Referring to FIG. 2, the verification management table 9 will be described below in detail. This table is provided corresponding to design data. The following information classified by verification items is registered in this table.

In this table, a verification item number 21 is the number which is given to every verification item and which is peculiar to the verification item.

A prerequisite verification item number 22 is the number of the prerequisite verification item for every item. If there is no relevant prerequisite verification item, this column is provided as a blank space. If there are a plurality of prerequisite verification items, a plurality of numbers may be registered in this column.

A test data number 23 is the number of test data used for verification by logic simulation for every verification item. The test data registered in this column is that registered on the test data file 3.

A digestion schedule date 24 is the date on which every verification item is scheduled to be digested.

A failure state 25 is the state of production of failures at the point of time when the failures are extracted by verification for every item. If verification is not yet performed, a blank space is registered in this column. If verification is being performed or has been performed, the number of failures extracted by one simulation is registered in this column. Although this embodiment shown in FIG. 2 has been made upon the case where the number of failures is registered in this column, the present invention can be applied to the case where not only the number of failures but also design data change management number are registered in this column.

A design data history 26 is the history of design data at the point of time when verification of the item is performed at the last. If verification is not yet performed, blank data is registered in this column. This history is updated by the design data input section 5 and recorded on the design data file 6 whenever design data is updated.

A confirmation date 27 is the date on which the expected operation of logic was confirmed. If there is no confirmation, blank data is registered in this column. When the date is written in this column, confirmation is considered to be finished.

In the example shown in FIG. 2, the following information is registered in each verification item. That is, the verification item "ITEST001" is verified by the test data "DATA00". There is no prerequisite verification item for this item. The digestion schedule date is April 15. Although there is one failure extracted by the verification of this item, confirmation was finished on the date of April 15 in the design data of the history "010". With respect to the verification item "TEST003", the prerequisite verification item is "TEST001" and the test data to be used is "DATA01". Although one failure was extracted and verification was performed in the history "012", the normal operation of logic is not yet confirmed. With respect to the verification item "TEST004", the digestion schedule date is April 20 and verification is not yet performed.

In the above description, the information to be registered such as the verification item number 21, the prerequisite verification item number 22, the test data number 23 and the digestion schedule date 24 is inputted by the verification manager before verification, and the inputted information is then registered. Further, the information such as the failure state 25, the correction state 26 and the confirmation date 27 is registered by the verification manager or from the logic simulator 7 or the design data input section 5 whenever verification is performed.

Referring to FIG. 3 which is a flow chart, a logic verification routine according to an embodiment of the present invention and the operations of respective sections will be described below.

(1) First of all, the verification manager registers necessary verification item information in the verification management table 9 from the terminal 1 through the verification management table input section 11 (process 301).

(2) Then, logic verification is started. Test data 4 corresponding to the verification item is generated (process 302).

(3) The test data 4 thus generated is registered in the test data file 3 through the terminal 1 and the test data input section 2. After the generation of the test data, the test data 4 and the design data file 6 are designated to thereby request the logic simulator 7 to execute logic simulation (process 303).

(4) The verification management section 10 determines whether logic simulation can be really performed or not, in accordance with the following determination method on the basis of the information registered in the verification management table 9 (process 304).

(5) In the case where the determination in the process 304 makes a decision that logic simulation can be performed, the logic simulator 7 performs logic simulation really (process 305).

(6) Then, the results of the logic simulation are determined and registered in the verification management table 9. When, for example, it is confirmed that the operation of logic as a subject of verification is normal, the history 26 of the design data used and the confirmation date 27 thereof are registered on the verification management table 9 in the column having the used test data number 23. On the contrary, in the case where the operation of logic as a subject of verification is abnormal, the failure state 25 of the verification item is counted up and registered in the history 26 of the used design data. In this case, the confirmation date 27 is not registered.

In the case where this process is to be carried out manually by the verification manager, the determination of results of logic simulation is performed on the basis of a logic simulation result list and the registration of the results into the verification management table 9 is performed, by the terminal 1, through verification management table input section 11. Alternatively, this process may be carried out by the logic simulator 7. In this case, not only the test data but also an expected value are inputted at the time of execution of simulation. The logic simulator 7 compares the logic simulation result with the expected value. When the two are coincident with each other, the logic simulator 7 makes a decision that the operation of logic is normal. When the two is not coincident, the logic simulator 7 makes a decision that the operation of logic is abnormal. The logic simulator 7 registers necessary data in the verification management table 9 in the same manner as described above in accordance with the result (process 306).

(7) A determination is made from the logic simulation result as to whether there is any failure detected. If there is some failure detected, the verification manager analyzes the failure and corrects the logic and then the situation of the routine goes back to the process 303 to request the logic simulator 7 to execute logic simulation again (processss 307 to 309).

(8) When the determination in the process 307 makes a decision that there is no failure detected, a determination is made as to whether all verifications are terminated or not. If all verifications are not terminated, the situation of the routine goes back to the process 302 to execute processing of the next test data. If all verifications are terminated, the routine shown in FIG. 3 is terminated (process 310).

(9) When the determination in the process 304 makes a decision that logic simulation cannot be performed, the prerequisite verification item 22 for the verification item 21 is not yet confirmed or the failure previously extracted in the verification item is not yet corrected as will be described later. Accordingly, measures such as failure analysis, logic correction, etc. are carried out on the verification items and then logic simulation with respect to the verification item is requested (processss 308 and 309).

In this case, the procedure for the verification item to be verified by using the test data generated by the process 302 is carried out after the confirmation of the subject of verification as a cause of the simulation execution disable state in the process 304 is perfected.

Figure 4:
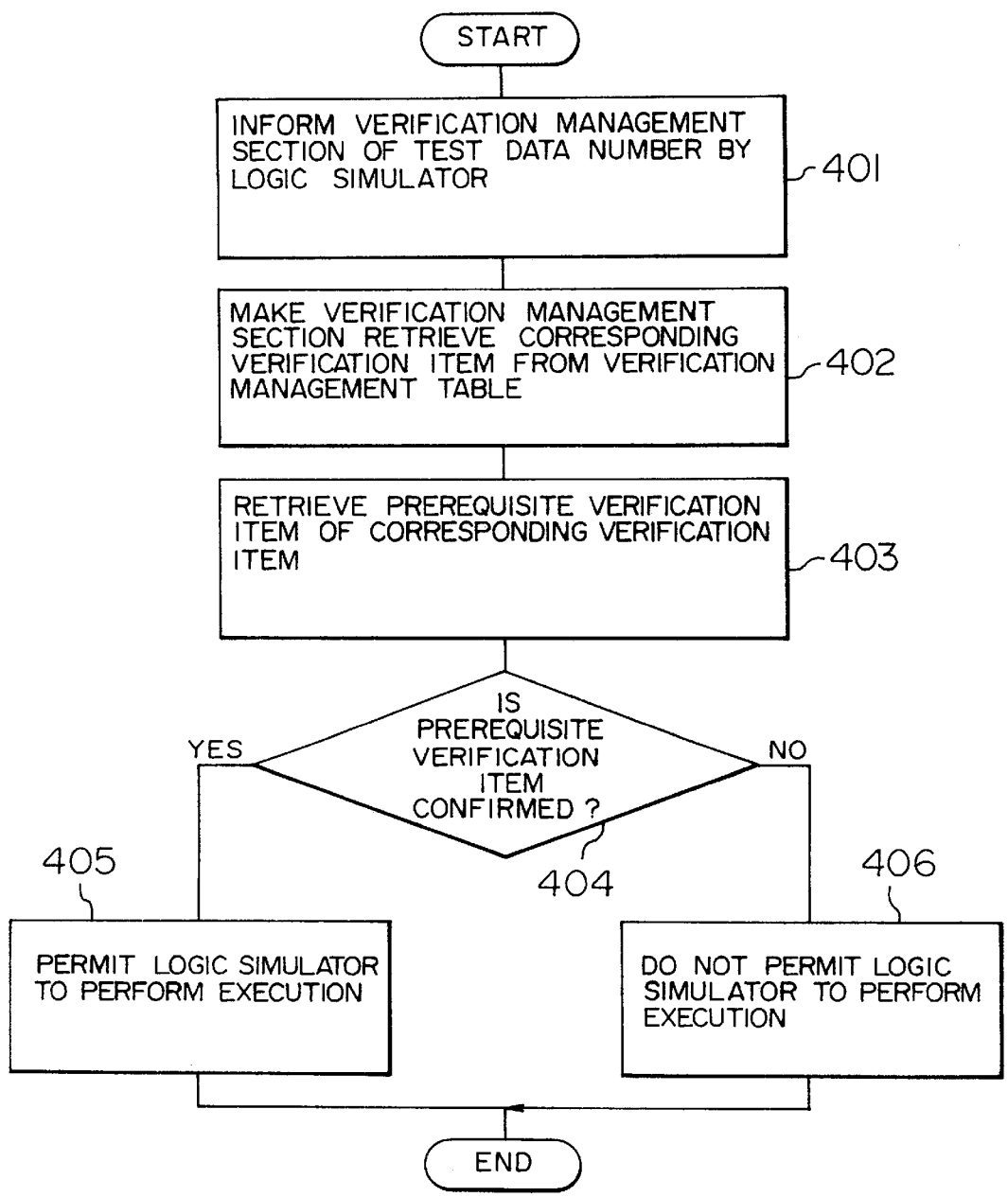
FIG. 4 is a flow chart showing a routine for determining whether logic simulation can be executed or not.

Referring to FIG. 4 which is a flow chart, the procedure of the process 304, that is, the routine of determination as to whether logic simulation can be executed or not, will be described below.

(1) First of all, the logic simulator 7 informs the verification management section 10 of the test data number to be simulated (process 401).

(2) The verification management section 10 retrieves a verification item 21 corresponding to the test data number by searching the verification management table 9 (process 402).

(3) Then, the verification management section 10 retrieves the confirmation state of a prerequisite verification item 22 for the verification item 21 by searching the verification management table 9 in the same manner as described above (process 403).

(4) A determination is made as to whether the prerequisite verification item has been already confirmed or not yet, that is, as to whether the confirmation date 27 has been already registered or not yet (process 404).

(5) In the case where the determination in the process 404 makes a decision that the prerequisite verification item has been already confirmed, the verification management section 10 permits the logic simulator 7 to execute simulation. In the case where the determination in the process 404 makes a decision that the prerequisite verification item has not yet confirmed, the verification management section 10 disables the logic simulator 7 from executing simulation. The logic simulator 7 follows the instructions of the verification management section 10 (processss 405 and 406).

In the case where an item which must have been digested is not yet digested as a prerequisite for logic verification of a certain item, verification of the prerequisite item can be avoided by using the aforementioned method. Accordingly, wasteful use of man-hours and computer resources caused by the retrial of verification and the like can be avoided.

Although the aforementioned determination method has shown the case where a determination is made as to whether simulation can be executed or not under the consideration of the prerequisite for the verification item, the present invention can be applied to the case where whether logic failure has been already corrected or not yet is considered by using the following method.

At the time of logic correction in the process 309 in FIG. 3, not only the design data but also the number of a verification item as a turning-point of correction are inputted into the design data input section 5 and recorded (as failure state) in the design data file 6. When logic simulation with respect to the verification item is requested again, the logic simulator 7 informs the verification management section 10 of the aforementioned verification item number and the history of the design data. The verification management section 10 checks up whether the thus received history is newer than the design data history 26 of the verification item registered in the verification management table 9. If the received history is newer, the verification management section 10 makes a decision that the logic has been already corrected. Otherwise, the verification management section 10 makes a decision that the logic has been not yet corrected. Only in the case where the prerequisite verification item has been already confirmed and where the design data history is newer than the previous history, the verification management section 10 permits execution of logic simulation.

By using the determination method using this procedure, there can be avoided such waste that verification is repeated without correction of the failure in the verification item.

Figure 5:
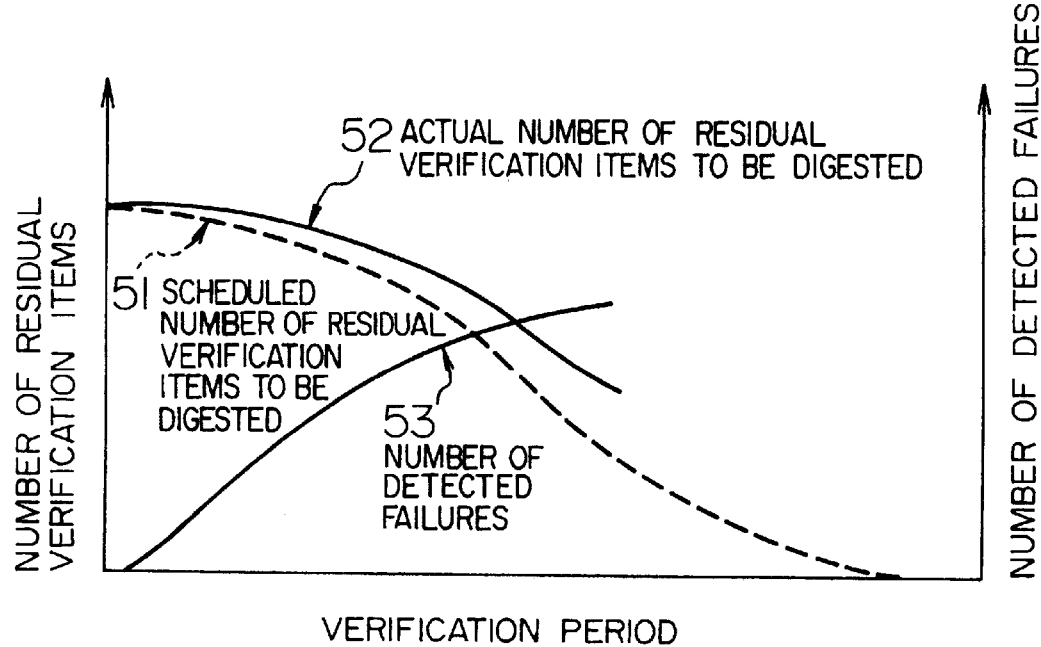
FIG. 5 is a graph showing an example of output of verification management data obtained by totalizing the state of digestion of verification items and the state of extraction of failure.

Referring to FIG. 5 which shows an example of output of verification management data, and referring to FIG. 6 which is a flow chart of the routine for generating the output example, the processing operation of the management information totalizing section 12 will be described below. Although the following description is made upon the case where the number of digested verification items and the number of produced failures are checked every week, it is a matter of course that the checking interval is not limited to the interval of a week and that the checking interval may be the interval of a day or the like.

In the output example of the management information totalizing section 12 shown in FIG. 5, collection of the state of digestion of verification items and the state of extraction of failures is expressed by a graph. In the graph, the scheduled number 51 of residual verification items to be digested, the actual number 52 of residual verification items to be digested, and the number 53 of produced failures are outputted so that the changing state in a verification period can be understood at a glance. Although the above description has been made upon the case where the graph as shown in FIG. 5 is used as an output means, the invention can be applied to the case where a table or the like is used as an output means.

Figure 6:
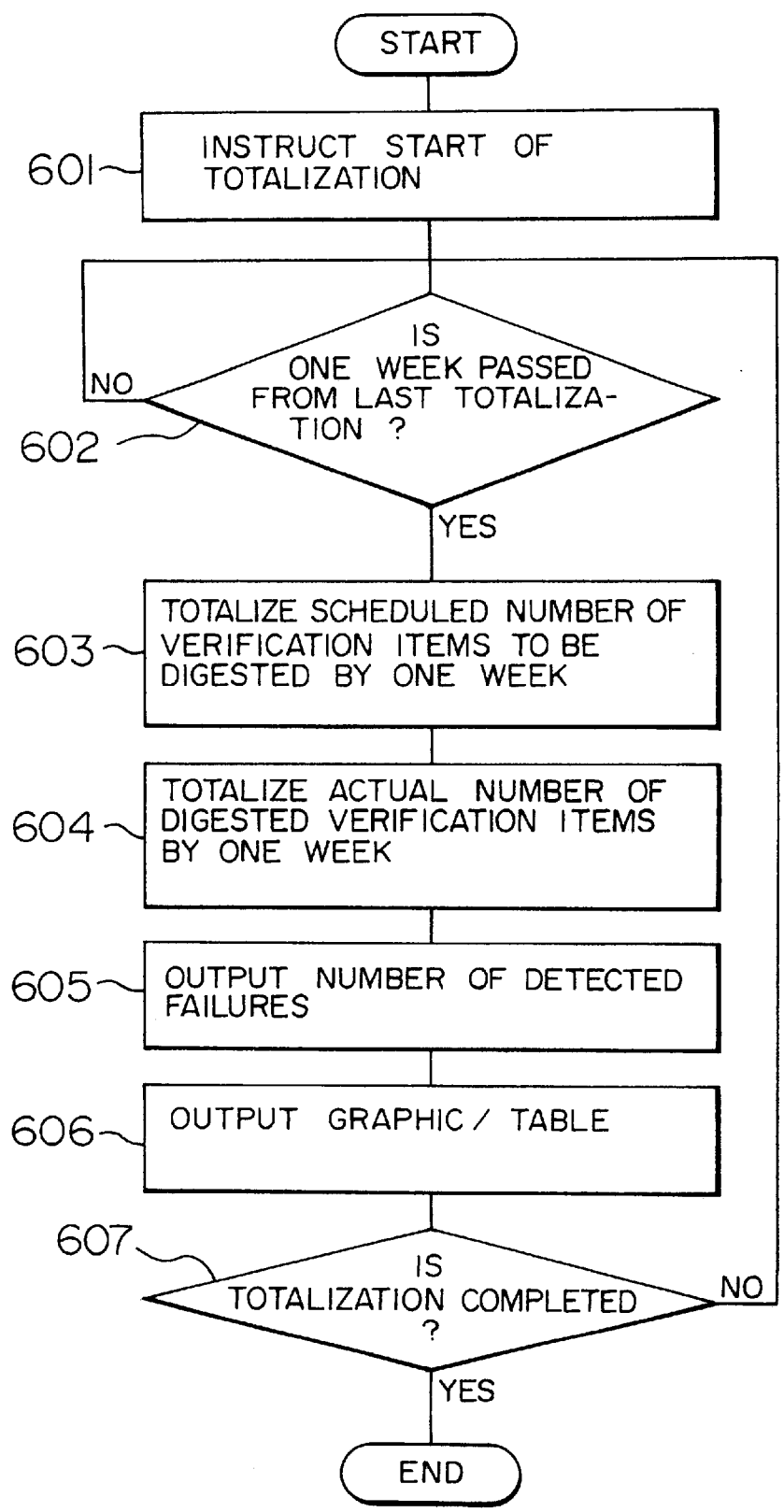
FIG. 6 is a flow chart showing a routine for totalizing verification management information.

Referring to FIG. 6 which is a flow chart, a flow of the operation will be described below.

(1) When the management information totalizing section 12 is instructed from the terminal 1 to start totalization, the management information totalizing section 12 determines whether one week has passed since the previous totalization or not. When it is confirmed that one week has passed, the management information totalizing section 12 starts execution of totalization (processs 601 and 602).

(2) The digestion schedule date 24 on the verification management table 9 is now retrieved. Then, the respective numbers of items scheduled to be digested are totalized at intervals of one week in the period of from the verification start point of time to the scheduled verification end point of time, so that the scheduled number 51 of residual verification items to be digested is obtained on the basis of the total number of items (process 603).

(3) Then, the confirmation date 27 on the verification management table 9 is retrieved. Then, the respective numbers of confirmed items are totalized at intervals of one week in the period of from the verification start point of time to the current point of time, so that the actual number 52 of residual verification items to be digested is obtained on the basis of the total number of items (process 604).

(4) Then, the failure state 25 on the verification management table 9 is retrieved, so that the respective numbers 53 of produced failures are totalized at intervals of one week in the period of from the verification start point of time to the current point of time (process 605).

(5) Finally, the thus totalized data are outputted in the form of a graph as shown in FIG. 5 (process 606).

(6) A determination is made as to whether all totalizations are terminated or not. Unless all totalizations are terminated or unless completion of all totalizations is taught, the procedure from the process 602 onward is repeated (process 607).

Although the aforementioned embodiment has shown the case where the numbers of scheduled items and the like are totalized every time, all data can be obtained easily by totalizing the number of items digested after the last totalization and the number of failures extracted after the last totalization if results of totalizations up to the last totalization are recorded in the management information totalizing section 12.

Although the aforementioned embodiment has shown the case where the scheduled number of residual verification items to be digested and the actual number of residual verification items to be digested are outputted in the form of a graph, the present invention can be applied to the case where the accumulation of the scheduled number of verification items to be digested and actual number of digested verification items, and so on, are outputted.

By using this method, data necessary for management of logic verification processs can be obtained automatically, so that project members including a manager can always accurately grasp the state of progress of verification, the quality of logic and the like by using the data.

Figure 7:
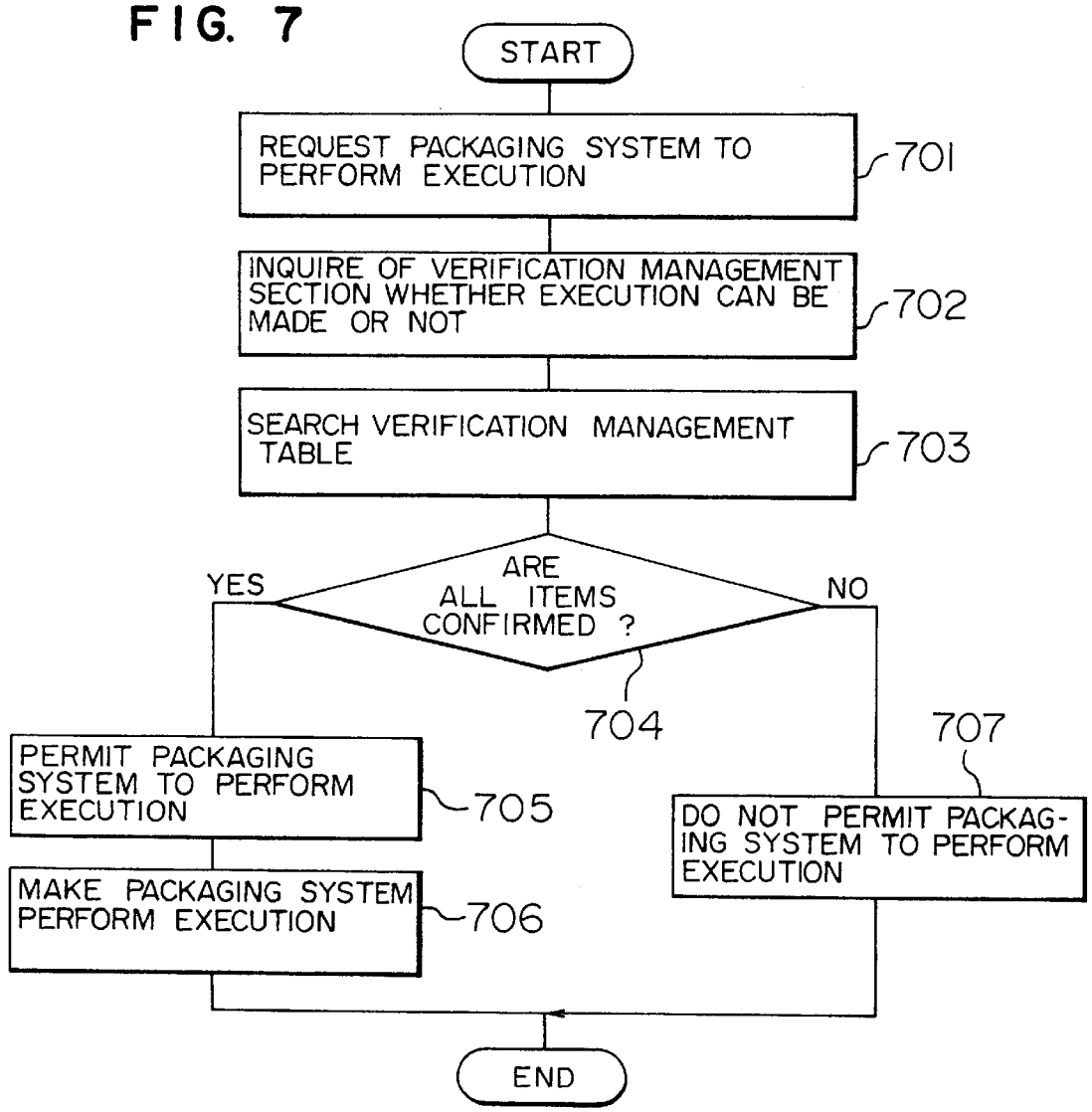
FIG. 7 is a flow chart showing a routine for determining whether a packaging data generating system can be executed or not.

Referring to FIG. 7 which is a flow chart, the processing operation of the packaging data generating system 8 will be described below.

(1) When the packaging data generating system 8 is requested to generate packaging data, the packaging data generating system 8 inquires of the verification management section 10 whether execution can be made or not (processs 701 and 702).

(2) The verification management section 10 searches the verification management table 9 and determines whether confirmation dates have been already registered for all verification items on the table 9, that is, whether all verification items have been already confirmed or not (processs 703 and 704).

(3) When the determination in the process 704 makes a decision that all verification items have been already confirmed, the verification process is considered to be completed. Accordingly, the verification management section 10 permits the packaging data generating system 8 to execute the generation of packaging data. Hence, the packaging data generating system 8 executes the process of generating packaging data to determine the arrangement of parts and logic blocks to thereby determine wiring (processs 705 and 706).

(4) When the determination in the process 704 makes a decision that there is any unconfirmed item in verification items, the verification management section 10 determines that it is still premature to generate packaging data because the verification process is uncompleted, and informs the packaging data generating system 8 that execution cannot be made. In this case, the packaging data generating system 8 does nothing before the routine is terminated (process 707). Here, not only the prohibition of execution is reported but also unconfirmed verification items are retrieved and transmitted to the terminal 1. In the terminal 1, the unconfirmed verification items thus transmitted are visually indicated on a display.

According to an embodiment of the present invention, by carrying out the aforementioned routine before the packaging data generating system 8 is made to start execution, there can be avoided the situation where packaging data must be generated again because packaging data is generated before the completion of the verification process and because failure is found after the generation of packaging data.

Although the above description has been made upon the case where it is necessary to confirm all verification items before the start of the generation of packaging data, the invention can be applied to the case where all verification items are not always digested before the start of the generation of packaging data. In this case, whether each verification item has to be digested at the point of time of the start of the generation of packaging data or not is registered in the verification item on the verification table 9, so that the verification management section 10 permits the packaging data generating system 8 to execute the generation of packaging data only in the case where all verification items which must be digested are already digested when the packaging data generating system 8 is requested to execute. By the aforementioned measure, packaging data can be generated even in the case where specific verification items are not yet digested.

According to the aforementioned embodiment of the present invention, verification of erroneous items can be avoided in logic verification laying stress on logic simulation, so that management of process of the verification process and management of the state of logic quality can be performed easily.

The aforementioned embodiment of the present invention can be modified as follows, in accordance with the method of forwarding logic verification.

In real logic verification, generally, items which have been once confirmed may have to be verified again because of the occurrence of the change of logic, the missing of failures at the time of confirmation of logic simulation results, and so on. In such a case, confirmation dates for the verification items on the verification management table 9 must be cleared. This is because the verification management section 10 does not permit execution of verification of the items as long as the confirmation dates are already registered. With respect to verification items including, as prerequisite verification items, the verification items with the confirmation dates cleared, it is also necessary to clear confirmation dates. This is because these items must be verified again.

This clearing can be performed by the verification manager from the terminal 1 through the verification management table input section 11. In this case, verification items including as prerequisite verification items the verification items with the confirmation dates cleared are retrieved from the verification management table 9 by the verification management section 10 so that confirmation dates for the verification items can be cleared. Accordingly, the number of processes required in accordance with the correction of registration information can be reduced, so that the prevention of omission of correction and the identification of items to be re-confirmed can be made.

Further in logic verification, not only logic simulation is made by the logic simulator 7 but also desk verification is made manually. In this case, it is necessary that data for the manual checking are registered and managed on the verification management table 9. Here, the data registered on the verification management table 9 may be used to be common to manual checking and logic simulation, and the initial registration and updating of the data may be performed from the terminal 1 through the verification management table input section 11.

However, because verification is made manually, there is a risk that verification may be made though the prerequisite verification items are not yet digested. Therefore, the confirmation states of the prerequisite verification items are retrieved from the verification management table 9 at the time of the registration of the confirmation states by the verification management table input section 11 so that the confirmation state data can be accepted only in the case where they are already confirmed. Accordingly, the registration of erroneous confirmation states can be prevented.

Further, with respect to an item in which failure occurs, the verification management table 9 is used so that confirmation state data can be accepted only when the item has been already corrected. As a result, even in the case where the verification manager makes a mistake in verification items to be used, an alarm or the like can be given to the verification manager.

What is claimed is:

1. A design support system comprising:

logic simulation execution means for executing logic simulation for each verification item to be executed by giving test data for logic verification of design data to said design data which is an object of the verification item to be executed;

table storage means for relationally storing, for each verification item, at least:

(i) a pertinent verification item number for identifying said verification item, (ii) information for management of said verification item including a prerequisite verification item number for identifying a prerequisite verification item whose confirmation is a prerequisite for an execution of verification of said verification item, (iii) confirmation information indicating that logical verification for said prerequisite verification item has been completed without detection of a failure, (iv) failure state information indicating whether a failure occurred in the last logic simulation on the verification item, and (v) design data history indicating a design data version used a latest logic simulation of said verification item;

instruction means for determining, by searching said table storage means, before logic simulation executed by said logic simulation execution means, whether said logic simulation can be executed or not;

a verification management section for checking whether received design data history is newer than design data history of the verification item registered in the verification management table, when the received design data history is newer the verification management section determines that the logic has not yet been corrected; and in response to the determination from the confirmation information and design data history, said instruction means does not permit said logic simulation execution means to perform execution in a case where at least one of a failure state is generated by the last logic simulation of the verification item to be executed and where the design data history indicates the design data version used in the current logic simulation is identical with the design data version stored in said table storage means.

2. A design support system comprising:

logic simulation execution means for executing logic simulation for each verification item to be executed by giving test data for logic verification of design data to said design data which is an object of the verification item to be executed, the verification item verifying functions of a computer system;

table storage means for relationally storing, for each verification item, at least:
  (i) a pertinent verification item number for identifying said verification item,
  (ii) information for management of said verification item including a prerequisite verification item number for identifying a prerequisite verification item whose confirmation is a prerequisite for execution of verification of said verification item,
  (iii) confirmation information indicating that logical verification for said prerequisite verification item has been completed without detection of a failure,
  (iv) failure state information indicating whether a failure occurred in the last logic simulation on the verification item, and
  (v) design data history indicating a design data version used in the last logic simulation of said verification item; and instruction means for determining, by searching said table storage means, before logic simulation executed by said logic simulation execution means, whether said logic simulation can be executed or not, in response to the determination from the confirmation information, said instruction means does not permit said logic simulation execution means to perform execution in a case where a failure state is generated by the last logic simulation of the verification item to be executed and where the design data version used in the current logic simulation is identical with the design data version stored in said table storage means.

3. A design support system according to claim 2, further comprising:

visual output means for visually outputting the result of logic simulation; and wherein said instruction means retrieves unconfirmed verification items from all verification items as prerequisites and supplies the result of retrieval to said visual output means.

4. A design support system according to claim 2, further comprising:

visual output means for generating a visual output to indicate the fact that the design data version is different when said permission of execution is not given.

5. A design support system according to claim 2, further comprising:

means for storing an expected value for test data with respect to a verification item to be executed; and verification success or failure determination means for comparing an output result of said execution means with said expected value to determine success or failure of verification.

6. A design support system according to claim 5, further comprising:

updating means for writing the result of comparison in said table storage means to thereby update said table storage means.

7. A design support system according to claim 6, wherein:

said updating means writes failure information and confirmation information into said table storage means on the basis of the result of the verification success or failure determination by said verification success or failure determination means, corresponding to said verification items.

8. A design support system according to claim 7, wherein:

when said updating means writes confirmation information of a verification item into said table storage mean, said updating means searches for confirmation information of a prerequisite verification item for said pertinent verification item, so that said updating means does not record confirmation information in said pertinent verification item in the case where said prerequisite verification item is not yet confirmed.

9. A design support system according to claim 6, wherein:

in the case where a failure occurs in a verification item which has been once recorded as "confirmed" in said table storage means, said updating means searches for another verification item which uses the pertinent verification item as a prerequisite verification item and updates said table storage means so that, when the confirmation information of said other verification item is expressed to be "conformed", said updating means changes the confirmation information of said other verification item from "confirmed" into "unconfirmed".

10. A design support system according to claim 2, further comprising:

means for generating packaging data necessary for packaging design data on the basis of said design data; and wherein said instruction means retrieves whether all verification items with respect to said design data have been already confirmed or not yet, and permits said packaging data generating means to perform execution in the case where all the verification items have been already confirmed.

11. A design support system according to claim 2, wherein:

said table storage means further stores time limit information indicating a time limit in which confirmation of verification of the pertinent verification item is to be completed; and wherein said system further comprises:

means for reading the time limit information and the confirmation information from said table storage means, for totalizing the information and for outputting the totalized information as an output result; and means for visually outputting said output result.

12. A design support method in a design support system having a processor for performing logic simulation on the basis of design data as a subject of logic verification and test data for logic verification of said design data, and a memory, the method comprising the steps of:

relationally storing in a table storage means, for every verification item to be executed, the verification item verifying functions of a computer system, at least:
  (i) a verification item number for identifying the verification item,
  (ii) a prerequisite verification item number for identifying a prerequisite verification item which must be confirmed as a prerequisite for execution of verification of said verification item,
  (iii) confirmation information indicating whether a failure has been confirmed in the prerequisite verification item, and
  (iv) design data history indicating a design data version used in a latest logic simulation of said verification;

before executing a logic simulation, with said processor, searching the table storage means to determine (i) whether the prerequisite verification item corresponding to the verification item to be executed has been already confirmed or has not yet been confirmed and (ii) whether the design data history is a newest design data history; and in response to the prerequisite verification item having been confirmed, and the design data history being confirmed as the newest design data history, executing said logic simulation.

13. A design support method according to claim 12, wherein:
when there is at least one unconfirmed prerequisite verification item of the prerequisite items in said determination process, said at least one unconfirmed prerequisite verification item is outputted visually.

14. A design support method according to claim 12, wherein:
an expected value for test data with respect to the pertinent verification item to be executed is stored in said storing process; and
the result of said logic simulation is compared with said expected value to determine success or failure of verification.

15. The design support method according to claim 12 further comprising:
selected the pertinent verification item to be executed;
referring to the table storage means to obtain a pertinent verification item number, a prerequisite verification item number and conformation information pertinent to the pertinent verification item to be executed; and,
determining that the prerequisite verification item has been simulated without any detection of failure, based on the pertinent verification item number, prerequisite verification item number and the confirmation information.

16. A design support system for logically verifying each of a plurality of verification items, which verify functions of a computer system, to which logical verification can be performed independently for each verification item, comprising:

a design data file for holding design data as an object of logic verification;

a test data file for holding test data for logic verification with respect to said design data;

input means for designating one of the verification items to be subjected to logic verification;

first storage means for relationally storing, for each verification item to be executed, a prerequisite verification item number for identifying a prerequisite verification item, confirmation information for indicating the fact that no failure has been confirmed in the prerequisite verification item;

execution means for executing logic simulation on the basis of said design data and said test data with respect to the designated pertinent verification item, and design data history indicating a design data version used in a latest logic simulation of the verification item;

second storage means for storing an expected value for test data with respect to the designated verification item to be executed;

determination means for comparing the result of execution by said execution means with said expected value to determine success or failure of verification; and updating means for writing the result of the determination by said determining means into said first storage means to thereby update the contents of said first storage means, including writing a newest design data history of the verification item registered in the verification management table.

17. A design support system according to claim 16, wherein:
said updating means writes failure information and confirmation information into said first storage means on the basis of the result of the verification success or failure determination obtained by said determining means, corresponding to said pertinent verification item.

18. A design support system according to claim 17, wherein:
in the case where a failure occurs in a verification item which has been once recorded as "confirmed" in said first storage means, said updating means searches for another verification item which uses the pertinent verification item as a prerequisite verification item and updates said table storage means so that, when the confirmation information of said other verification item is expressed to be "conformed", said updating means changes the confirmation information of said other verification item from "confirmed" into "unconfirmed".

* * * * *